United States Patent [19]
Vrionis

[11] Patent Number: 5,880,464
[45] Date of Patent: Mar. 9, 1999

[54] OPTICAL METER READER USING A SHADOW

[75] Inventor: Nick G. Vrionis, Los Altos, Calif.

[73] Assignee: Diablo Research Corporation, Sunnyvale, Calif.

[21] Appl. No.: 871,813

[22] Filed: Jun. 9, 1997

[51] Int. Cl.⁶ .................................................. G08S 23/00
[52] U.S. Cl. ............... 250/230; 340/870.02; 340/870.22
[58] Field of Search .............................. 250/230; 324/96, 324/157; 340/870.02, 870.22, 637, 688; 382/100; 705/412

[56] References Cited

U.S. PATENT DOCUMENTS

| | | | |
|---|---|---|---|
| 3,639,747 | 2/1972 | Schmidt | 350/96.24 |
| 4,680,704 | 7/1987 | Konicek et al. | 364/525 |
| 4,688,038 | 8/1987 | Giammarese | 340/870.02 |
| 5,056,107 | 10/1991 | Johnson et al. | |
| 5,140,351 | 8/1992 | Garcia et al. | 385/117 |

Primary Examiner—Stephone Allen
Attorney, Agent, or Firm—David R. Gildea

[57] ABSTRACT

A meter reader for reading a meter by reading a shadow made by a meter pointer on the face of the meter. The meter reader includes a light source for shining a light toward the meter, a pulse control circuit for pulsing the light source, two light sensors for receiving reflections of the pulsed light from two sections of the face, a detection circuit for detecting the intensity of the reflections received by each of the sensors, a microprocessor system for calculating an intensity relationship between the intensities received by each of the sensors, a counter for incrementing a meter readout count when the intensity relationship varies indicating that the shadow has passed over both sections of the meter face, and a transmitter for transmitting the meter readout count in a meter readout signal.

19 Claims, 2 Drawing Sheets

OPTICAL METER READER USING A SHADOW

BACKGROUND OF THE INVENTION

1. Field of the Invention

The invention relates generally to systems for reading meters and more particularly to a method and an apparatus for automatically reading a utility meter by optically reading a shadow of a meter pointer that falls on a meter face.

2. Description of the Prior Art

Meters are commonly used by utility companies for measuring and providing a readout for the quantity of water, gas, or electricity that has been used in a commercial or residential establishment. Historically, the meter readout is read by a person who walks or drives from establishment to establishment and then reports the readings to an office. Such process is labor intensive, subject to human error, and in certain circumstances may not be safe for the person. In order to eliminate these problems, automatic reporting meters have been developed that integrate the capability of measuring the amount of water, gas, or electricity with the capability of communicating the measurement to the office using either wired or wireless signal transmission. However, reporting meters are generally limited by economics to new meter installations. In order to improve the economics for existing utility meters installations, several meter reader interfaces have been developed or proposed that retrofit to an existing meter. These meter reader interfaces automatically read the position of the meter pointer with respect to the meter face using optics and communicate the meter reading in a signal transmission. Typically, the optical frequency that is used is in the infrared range because optical components are least expensive in that range. Unfortunately, the reflection coefficient of the pointer and the reflection coefficient of the face in the infrared range are not greatly different in certain meters thereby decreasing the reliability with which the meter can be read.

BRIEF SUMMARY OF THE INVENTION

It is therefore an object of the present invention to provide an apparatus for reading a meter by optically reading a shadow of a meter pointer that falls upon a meter face.

Another object of the present invention to provide a method for reading a meter by optically reading a shadow of a meter pointer that falls upon a meter face.

Briefly, in a preferred embodiment, a meter reader of the present invention is adapted to read a meter having a pointer that rotates to indicate a meter readout on a meter face. The meter reader includes a light source for shining an infrared light toward the pointer; a pulse control circuit for pulsing the light source; two infrared light sensors for receiving reflections of the light pulse from two separate sections of the face; a detection circuit for detecting the intensity of the reflections received by each of the sensors; a microprocessor system for calculating an intensity relationship between the reflections received by each of the sensors; a counter for incrementing a meter readout count when the intensity relationship varies in a manner that indicates that the shadow of the light is passing the two sections; and a transmitter for transmitting the meter readout count in a meter readout signal. Detecting the reflections from two separate sections of the face enables the meter reader to differentiate the shadow from variations in ambient light and prevents the meter readout count from continuing to increment when the pointer is stationary.

An advantage of a meter reader apparatus and method of the present invention is that the shadow of a meter pointer against a meter face is detected, therefore, the meter reader is not affected by similar reflection coefficients of light for the pointer and the face.

These and other objects and advantages of the present invention will no doubt become obvious to those of ordinary skill in the art after having read the following detailed description of the preferred embodiments which are illustrated in the various figures.

DETAILED DESCRIPTION OF THE INVENTION

Figure 1A:
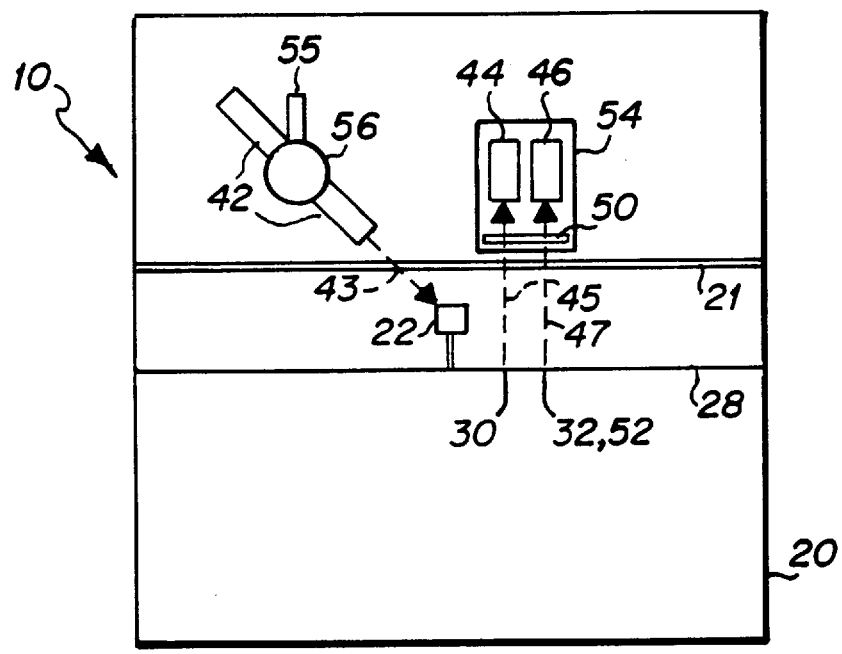
FIGS. 1a and 1b are illustrations of a side and top view, respectively, a meter reader interface of the present invention disposed for reading a meter.
Figure 1B:
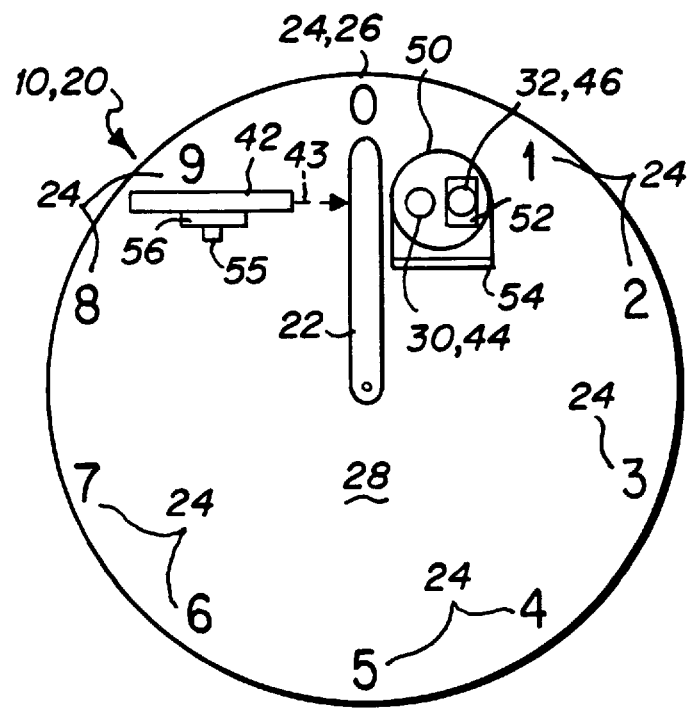

FIGS. 1a and 1b are illustrations of a side and top view, respectively, of the present invention of a meter reader referred to by the general reference number 10 for reading a meter 20. The meter 20 has a clear cover 21 for sealing against tampering and weather, a rotating pointer 22 for indicating a meter readout by pointing to readout locations 24, including a certain meter readout location 26, on a meter face 28. In a typical application the meter readout is indicative of a quantity of water, gas, or electricity that has flowed. The readout locations 24 are usually numbered on the outer part of the face 28. The inner part of the face 28, including a first section 30 and a second section 32, is mostly blank.

The meter reader 10 includes a light source 42 for emitting a light 43, a first light sensor 44 for receiving light from a first reflection 45 and a second light sensor 46 for receiving light from a second reflection 47, all mounted outside of the cover 21 in order to be retrofitable to the meter 20. In a preferred embodiment the light source 42 includes a light emitting diode (LED), such as a model SFH484 available from Siemens Components Inc. of Cupertino, Calif., and the first and second light sensors 44, 46 include photodiodes operating in the infrared frequency range, such as a model types BP104 or BPX90 also available from Siemens Components Inc. The light source 42 is oriented for shining its light 43 at the pointer 22 when the pointer 22 points to the meter readout 26. Preferably the light source includes a collimating lens. The first light sensor 44 is oriented for receiving the first reflection 45 of light from the first section 30 of the face 28 and the second light sensor 46 is oriented for receiving the second reflection 47 of light from the second section 32 of the face 28. Preferably, a lens 50 having a large aperture focuses the light in the first and second reflections 45, 47 for the distance to the first and second sections 30, 32. Alternatively, each of the light sensors 44, 46 may use a separate lens. When the pointer 22 is rotating in a clockwise direction, just before the pointer 22 points to the meter readout location 26, a shadow 52 falls on the first section 30 but not the second section 32 causing the light received by the first sensor 44 to be less than the light received by the second sensor 46. When the pointer 22 rotates slightly to point to the meter readout location 26 the shadow 52 falls on the second section 32 (as shown in FIG. 1B) but not the first section 30 causing the light received by the second light sensor 46 to be less than the light received by the first light sensor 44. In a preferred embodiment the light 43 is pulsed. The meter reader 10 reads the meter 20 by calculating an intensity relationship for the light received by the first light sensor 44 compared to the light received by the second light sensor 46 for each pulse of light 43 and counts each time that the variation in the intensity relationship indicates that the shadow 52 is passing over the first and second sections 30 and 32 of the face 28.

Preferably the angle of the light source 42 and the height of the light source 42, the first and second sensors 44 and 46, and the lens 50 are fixed mechanically within the meter reader 10 according to the heights of the meter reader 10 above the meter 20 and the pointer 22 above the face 28 for the particular type of the meter 20. Alternatively, a height adjustment carrier 54 uses a collar that may be tightened or one or more bolts and several alternative holes mechanically for adjusting the height of an assembly for the first and second sensors 44, 46 and/or the lens 50 and the light source 42. Similarly, the light source 42 may include a height adjuster 55 using a collar or bolts and/or an angle adjuster 56 using a pivot hole and a pivot pin having a knob that may be turned into a threaded hole for tightening.

Figure 2:
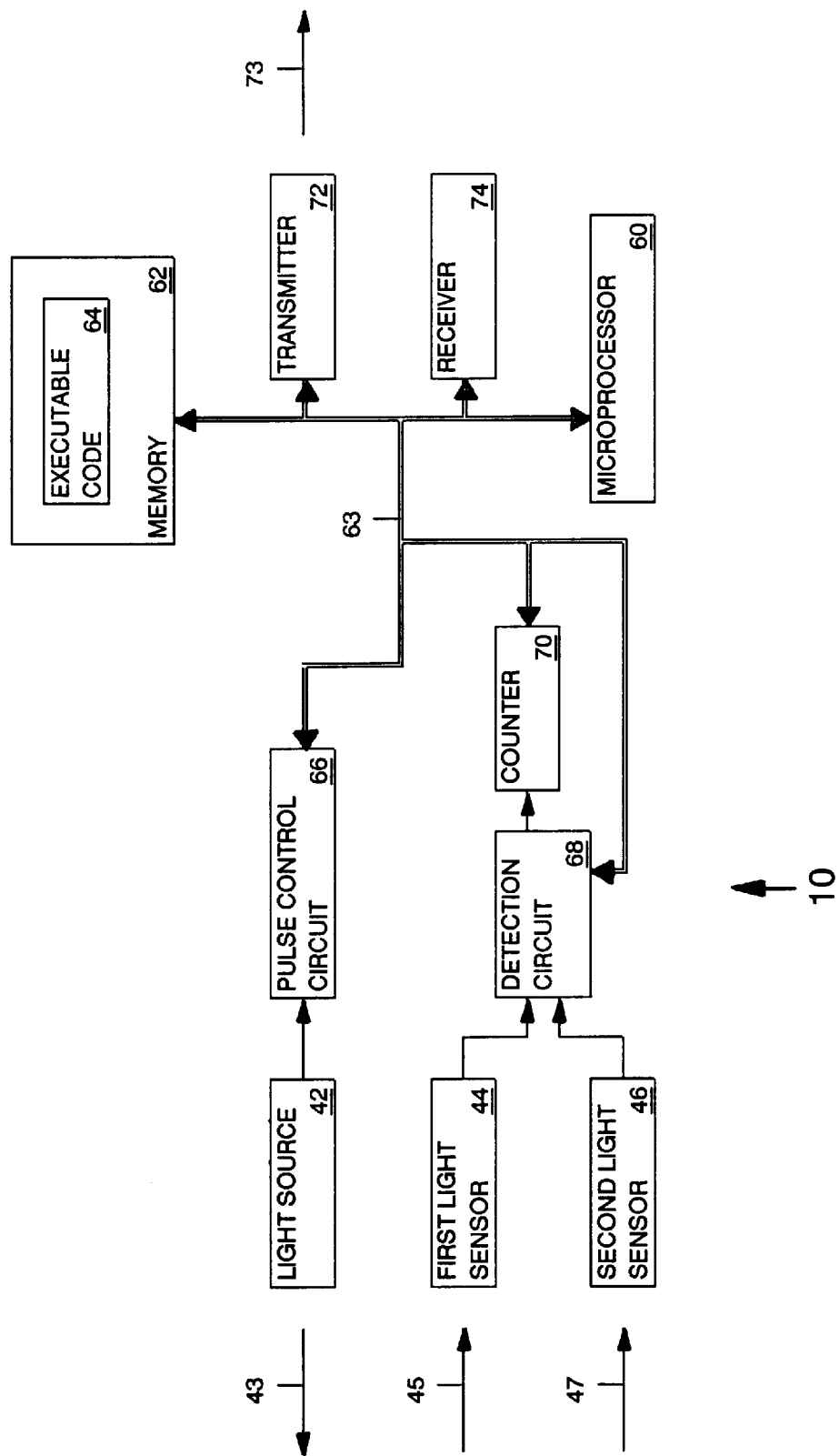
FIG. 2 is a block diagram of the meter reader interface of FIGS. 1a and 1b.

FIG. 2 illustrates a block diagram of the meter reader 10. The meter reader 10 includes a microprocessor 60 and a memory 62 operating over a microprocessor bus 63. The memory 62 includes memory space for variable data and an executable code 64. The executable code 64 includes instructions for causing the microprocessor 60 to read and write data to the memory 62 and to receive and issue signals on the microprocessor bus 63 to control elements of the meter reader 10 in a conventional manner.

A pulse control circuit 66 modulates the light source 42 to provide pulsed light. In order to use the least power for battery operation, the light source 42 is pulsed with the lowest duty cycle that will insure that the shadow 52 falls upon each of the first and second sections 30, 32 (FIGS. 1a–b) for at least one pulse during each rotation of the pointer 22 (FIGS. 1a–b). In a preferred embodiment, the pulse rate may be predetermined based upon a known highest rate of rotation of the pointer 22 (FIGS. 1a–b) and the proportional angular width of the first and second sections 30, 32 (FIGS. 1a–b) to three-hundred sixty degrees. For example, if the pointer 22 (FIGS. 1a–b) rotates through a full three-hundred sixty degrees of angle of the readout locations 24 (FIGS. 1a–b) at a maximum rate of 1 time per second and the width of each of the first and second sections 30, 32 (FIGS. 1a–b) is six degrees of angle, then the pulse rate must be at least sixty times per second. The pulse width should be short as practical and the angular width as large as practical for reliable operation in order to minimize power consumption.

A detection circuit 68 including an analog-to-digital converter is connected to receive a first analog intensity signal from the first light sensor 44 and a second analog intensity signal from the second light sensor 46 where the first and second intensity signals are indicative of the light received by the first light sensor 44 and the second light sensor 46, respectively. The detection circuit 68 passes a digital detector output signal having information for the first and second intensity signals to the microprocessor 60. The executable code 64 includes instructions for directing the microprocessor 60 to receive the detector output signal and calculate the intensity relationship for the light received by the first light sensor 44 as compared to the light received by the second light sensor 46 for each pulse of light 43. Any one of several formulas may be used for calculating the intensity relationship. In a preferred embodiment the intensity relationship is calculated as the quantity of the amplitude, A, of the first intensity signal minus the amplitude, B, of the second intensity signal divided by the quantity of the amplitude, A, of the first intensity signal plus the amplitude, B, of the second intensity signal, as shown in equation 1 below.

$$\frac{A - B}{A + B} \qquad (1)$$

Assuming the first section 30 (FIGS. 1a–b) and second section 32 (FIGS. 1a–b) have the same reflection coefficients and the first light sensor 44 and the second light sensor 46 have the same offsets and conversion factors for converting light energy to intensity signals, the intensity relationship is zero when the shadow 52 (FIGS. 1a–b) does not fall upon either of the first and second sections 30 and 32 (FIGS. 1a–b) or falls equally upon both. When the shadow 52 (FIGS. 1a–b) falls more heavily on one of the sections 30, 32 (FIGS. 1a–b) than on the other, the intensity relationship has a plus or minus value. In the case where the pointer 22 (FIGS. 1a–b) rotates clockwise past the meter readout location 26 (FIGS. 1a–b), the shadow 52 (FIGS. 1a–b) first falls on the first section 30 (FIGS. 1a–b) causing the intensity relationship to go to approximately minus one and then falls on the second section 32 (FIGS. 1a–b) causing the intensity relationship to go to approximately plus one. In the case where the pointer 22 (FIGS. 1a–b) rotates counter-clockwise past the meter readout location 26 (FIGS. 1a–b), the shadow 52 (FIGS. 1a–b) first falls on the second section 32 (FIGS. 1a–b) causing the intensity relationship to go to approximately plus one and then falls on the first section 30 (FIGS. 1a–b) causing the intensity relationship to go to approximately minus one.

The executable code 64 includes instructions for directing the microprocessor 60 to perform as a counter 70 for counting the number of times the pointer 22 (FIGS. 1a–b) rotates to the meter readout location 26 (FIGS. 1a–b). Alternatively, the counter 70 may be constructed in hardware and controlled by the microprocessor 60 under instructions in the executable code 64. In a simple implementation, the counter 70 increments a meter readout count each time the intensity relationship has a variation that is greater than a selected threshold for indicating that the shadow 52 (FIGS. 1a–b) is beginning to fall on the first section 30 (FIGS. 1a–b), thereby decreasing the first reflection 45; but has not yet reached the second section 32 (FIGS. 1a–b), thereby the second reflection 47 remaining relatively constant. The executable code 64 may include instructions for applying hysteresis to the threshold prevent vibrations from causing multiple counts. In this embodiment, the second reflection 47 is used in the intensity relationship as a reference for the ambient light level. However, in order to prevent multiple increments of the meter readout count when the pointer 22 (FIGS. 1a–b) is stationary while the first section 30 (FIGS. 1a–b) is in the shadow 52 (FIGS. 1a–b), it is preferred to use two selected thresholds. In the case of a clockwise rotating pointer 22 (FIGS. 1a–b) the counter 70 increments the meter readout count each time the intensity relationship decreases below a first selected threshold, such as minus one-half, and then increases above a second selected threshold, such as plus one-half, indicating that the shadow 52 has passed the first section 30 (FIGS. 1a–b) and is passing the second section 32 (FIGS. 1a–b). Similarly, in the counter-clockwise case, the counter 70 increments a meter readout count each time the intensity relationship increases above the second selected threshold and then decreases below the first selected threshold indicating that the shadow 52 has passed the second section 32 (FIGS. 1a–b) and is passing the first section 30 (FIGS. 1a–b). In another preferred embodiment the meter readout count is incremented when the intensity relationship surpasses the first threshold but cannot increment again unless it is rearmed by the intensity relationship surpassing the second threshold. Both the first and second selected thresholds may be determined empirically. Optionally, the executable code 64 includes instructions for using the information derived during a time that the shadow does not fall on either the first section 30 (FIGS. 1a–b) or the second section 32 (FIGS. 1a–b) for calibrating the intensity relationship for differences between the reflection coefficients of the first and second section 30 and 32 (FIGS. 1a–b) and/or the offsets and conversion factors of the first and second light sensors 44 and 46. Of course, it will be obvious to someone skilled in the field of electronics design that the above polarities and levels of "minus one" and "plus one", the directions of "decrease" and "increase" with respect to the intensity relationship and the thresholds describe only a few of the ways in which the present invention may be embodied.

A transmitter 72 receives a signal having information for the meter readout count from the microprocessor 60 and transmits the meter readout count in an output signal. In a preferred embodiment the output signal is transmitted as a wireless signal as described in an allowed Pat. application Ser. No. 08/376109, now U.S. Pat. No. 5,734,966, by Farrer, Chan, Garry Jr., Glorioso, and Krasner which is incorporated herein by reference. Alternatively, the output signal is transmitted in one of the many other known wireless formats or over wires in a format such as telephone or cable television. An optional receiver 74 enables the meter reader 10 to receive control information over a wireless or wired link.

Although the present invention has been described in terms of the presently preferred embodiments, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A meter reader for reading a meter having a face and a pointer, the pointer having a relative position with respect to the face for indicating a meter readout, comprising:

a light source disposed for shining a light toward said pointer;

a light detector disposed for receiving at least one reflection of said light from at least one section, respectively, of said face; and a detection circuit, coupled to the light detector for detecting a variation in intensity of said reflection, said variation caused by a shadow made by said pointer from said light when said shadow passes over said section of said face, said shadow indicating said relative position of said pointer with respect to said face for indicating said meter readout.

2. The meter reader of claim 1, wherein:

the light detector includes at least two light sensors, a first said light sensor disposed for receiving a first said reflection from a first said section of said face and a second said light sensor disposed for receiving a second said reflection from a second said section of said face; and the detection circuit is for calculating an intensity relationship between an intensity of said first reflection and an intensity of said second reflection and detecting said variation in intensity when said intensity relationship surpasses at least one selected threshold.

3. The meter reader of claim 2, wherein:

said intensity relationship includes a ratio of a difference between said intensity of said first reflection and said second reflection to a sum of said intensity of said first reflection and said second reflection.

4. The meter reader of claim 2, further including:

a counter coupled to the detection circuit for incrementing a meter readout count when said intensity relationship sequentially surpasses a first said selected threshold for indicating said shadow is falling mainly upon one of said first and said second section and then passes a second said selected threshold for indicating said shadow is mainly falling upon the other of said first and said second section.

5. The meter reader of claim 4, further including:

a transmitter coupled to the counter for transmitting a meter readout signal having information for said meter readout count.

6. The meter reader of claim 4, wherein:

said meter readout count includes information for a quantity of one of (i) gas, (ii) water, and (iii) electricity.

7. The meter reader of claim 1, further including:

a pulse control circuit for controlling the light source for shining said light in pulses.

8. The meter reader of claim 1, wherein:

said meter includes a clear cover for covering said pointer and said face; and the meter reader is disposed for shining said light and receiving said at least one reflection through said clear cover without requiring removal of said cover for operation of the meter reader.

9. The meter reader of claim 1, wherein:

the light source includes a lens to collimate said light.

10. The meter reader of claim 1, further including:

a light source angle adjuster coupled to the light source for adjusting a vertical angle of said light; and a light source height adjuster coupled to the light source for adjusting a vertical height of said light source, the angle adjuster and height adjuster to act together to align said light with said pointer and at least one of said at least one section when said pointer indicates said meter readout.

11. The meter reader of claim 1, further including:

a lens for focusing at least one of said at least one reflection from a certain distance to said light detector; and a light detector height adjuster for adjusting a distance between the light detector and at least one of said at least one section of said face to said certain distance.

12. A method of reading a meter having a face and a pointer, said pointer having a relative position with respect to said face for indicating a meter readout, comprising steps of:

shining a light toward said pointer;

receiving at least one reflection of said light from at least one section, respectively, of said face; and detecting a variation in intensity of said reflection, said variation caused by a shadow made by said pointer from said light when said shadow falls on said section of said face, said shadow corresponding to said relative position of said pointer with respect to said face for indicating said meter readout.

13. The method of claim 12, further including a step of:

providing a meter reader for shining said light toward said meter, receiving said reflection of said light from said section of said face, and detecting said variation in intensity; and retrofitting said meter reader to said meter without disassembling said meter.

14. The method of claim 12, wherein:

the step of receiving said at least one reflection includes steps of: receiving a first said reflection from a first said section of said face; and receiving a second said reflection from a second said section of said face; and the step of detecting said variation in intensity includes steps of: calculating an intensity relationship between an intensity of said first reflection and an intensity of said second reflection; and detecting said variation in intensity when said intensity relationship surpasses at least one selected threshold.

15. The method of claim 14, wherein:

the step of calculating said intensity relationship includes a step of calculating a ratio of a difference between said intensity of said first and said second reflection to a sum of said intensity of said first and said second reflection.

16. The method of claim 14, further including a step of:

incrementing a meter readout count when said intensity relationship sequentially surpasses a first said selected threshold for indicating said shadow is falling more upon one of said first and said second section and then surpasses a second said threshold for indicating said shadow is falling more upon the other of said first and said second section.

17. The method of claim 16, further including a step of:

transmitting a meter readout signal having information for said meter readout count.

18. The method of claim 16, wherein:

said meter readout count provides information for a quantity of one of (i) gas, (ii) water, and (iii) electricity.

19. The method of claim 12, wherein:

the step of shining said light includes a step of pulsing said light.

* * * * *